(12) United States Patent
Ando

(10) Patent No.: US 9,065,226 B2
(45) Date of Patent: Jun. 23, 2015

(54) TUNER HAVING A FRAME WITH A THROUGH-HOLE AND A PRESSURIZATION PORTION FOR MOUNTING A CONNECTION PORTION WITH A FLANGE

(71) Applicant: FUNAI ELECTRIC CO., LTD., Osaka (JP)

(72) Inventor: Masahiro Ando, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 14/186,203

(22) Filed: Feb. 21, 2014

(65) Prior Publication Data

US 2014/0295701 A1    Oct. 2, 2014

(30) Foreign Application Priority Data

Mar. 26, 2013   (JP) ................. 2013-063149

(51) Int. Cl.
| | |
|---|---|
| H01R 13/64 | (2006.01) |
| H01R 13/74 | (2006.01) |
| H01R 12/50 | (2011.01) |
| H04N 5/655 | (2006.01) |
| H03J 1/00 | (2006.01) |
| H04N 5/50 | (2006.01) |
| H04N 5/64 | (2006.01) |
| H05K 9/00 | (2006.01) |

(52) U.S. Cl.
CPC ............ *H01R 13/74* (2013.01); *H01R 23/7052* (2013.01); *H01R 13/64* (2013.01); *H04N 5/655* (2013.01); *H03J 1/00* (2013.01); *H04N 5/50* (2013.01); *H04N 5/64* (2013.01); *H05K 9/006* (2013.01)

(58) Field of Classification Search
CPC ..................................................... H01R 13/629
USPC ............................................ 439/569–574, 372
See application file for complete search history.

(56) References Cited

U.S. PATENT DOCUMENTS

| | | | | |
|---|---|---|---|---|
| 3,534,321 | A * | 10/1970 | Malachowski | 439/382 |
| 4,738,626 | A * | 4/1988 | Reichle | 439/553 |
| 2010/0315183 | A1 | 12/2010 | Matsuzaki | |
| 2011/0269331 | A1 * | 11/2011 | Saber | 439/372 |
| 2013/0127491 | A1 * | 5/2013 | Kelem et al. | 326/9 |
| 2015/0011108 | A1 * | 1/2015 | Vanslambrouck et al. | 439/271 |

FOREIGN PATENT DOCUMENTS

JP    2010-287527 A    12/2010

* cited by examiner

*Primary Examiner* — Chandrika Prasad

(74) *Attorney, Agent, or Firm* — Morgan, Lewis & Bockius LLP

(57) ABSTRACT

A tuner comprises a frame that is provided with a through-hole and a connection portion to which a connector is connected. The connection portion includes a flange portion that is able to select to pass through the through-hole or not to pass through the through-hole by the connection portion being rotated, and the frame includes a pressurization portion that pressurizes the flange portion which passes through the through-hole.

5 Claims, 5 Drawing Sheets

TUNER HAVING A FRAME WITH A THROUGH-HOLE AND A PRESSURIZATION PORTION FOR MOUNTING A CONNECTION PORTION WITH A FLANGE

INCORPORATION BY REFERENCE

This application is based on and claims the benefit of priority from Japanese Patent Application No. 2013-063149 filed on Mar. 26, 2013, the contents of which are hereby incorporated by reference.

BACKGROUND OF THE INVENTION

1. Field of the Invention

The present invention relates to a tuner that tunes in a broadcast signal.

2. Description of Related Art

Conventionally, for example, a circuit apparatus, such as a tuner or the like for receiving a television broadcast signal, is known, which includes a connection base (receptacle and the like) into which a connector (plug and the like) is inserted. In such a circuit apparatus, the connection base is fixed to a frame of the circuit apparatus by soldering or deforming (e.g., see JP-A-2010-287527).

SUMMARY OF THE INVENTION

For example, in a case where the connection base is fixed to the frame by soldering, the connection base is once temporarily fixed to the frame. And, in this temporary fixed state, solder paste is applied to a portion that is to be connected, heating is performed by means of a reflow oven, and the connection base is soldered to the frame. In the case where the connection base is fixed to the frame by means of such a process, if the temporary fixing of the connection base to the frame is inadequate, there is a case where the connection base moves before the soldering ends.

For example, if the connection base is fixed to the frame with the connection base inclined because of the movement of the connection base, trouble is likely that a circuit board (tuner board) to be later mounted on the frame fails to be successfully mounted on the frame. And, occurrence of such trouble causes a decline in working efficiency.

In a process of producing a circuit board such as a tuner or the like, it is general that a frame to which a connection base is fixed temporarily is conveyed to another place, where the final fixing such as soldering or the like is performed. If the frame is conveyed under a state where the temporary fixing of the connection base is inadequate, it is highly likely that the connection base moves with respect to the frame. Because of this, it is very important whether the temporary fixing of the frame is good or not.

In light of the above points, it is an object of the present invention to provide a tuner in which a connection portion to which a connector is connected is surely fixed to a frame and it is possible to smoothly perform the mounting work of the connection portion.

To achieve the above object, a tuner according to the present invention is structured (first structure) to comprise: a frame that is provided with a through-hole; and a connection portion to which a connector is connected; wherein the connection portion includes a flange portion that is able to select to pass through the through-hole or not to pass through the through-hole by the connection portion being rotated; and the frame includes a pressurization portion that pressurizes the flange portion which passes through the through-hole.

According to the present structure, it is possible to pressurize a portion of the connection portion (connection portion put in a state not to come off the frame), to which the connector is connected, against a portion of the frame by means of pressurization from the pressurization portion disposed on the frame. Because of this, according to the present structure, it is possible to fix the connection portion to the frame under a state where the connection portion does not move easily (inclusive of a state where the connection portion does not rotate). Besides, according to the present structure, the connection portion is mounted on the frame by simple work of inserting a portion of the connection portion into the through-hole of the frame and rotating the connection portion; accordingly, it is possible to smoothly perform the mounting work.

In the tuner having the above first structure, the flange portion may be structured (second structure) to have a planar portion that includes a first direction for passing through the through-hole and a second direction for not-passing through the through-hole. According to the present structure, it is easy to form the connection portion and the frame with a simple structure.

In the tuner having the above first or second structure, it is preferable that the pressurization portion is structured (third structure) to change a pressurization force for pressurizing the flange portion in accordance with a rotation amount of the flange portion. In more detail, it is preferable that in a case where the rotation amount of the flange portion inserted through the through-hole becomes large, the pressurization portion has large force for pressurizing the flange portion. According to the present structure, it is possible to surely fix the connection portion to the frame without deteriorating the workability when mounting the connection portion onto the frame.

In the tuner having any one of the above first to third structures, it is preferable that the frame is structured (fourth structure) to include a limit portion that limits the rotation of the flange portion which is inserted into the through-hole. According to the present structure, it is possible to perform the mounting work of the connection portion by using the limit portion as a basis for the mounting; accordingly, the workability is good.

In the tuner having any one of the above first to fourth structures, a structure (fifth structure) may be employed, in which the frame includes a first side wall and a second side wall that meets the first side wall at right angles; wherein the through-hole is disposed through the first side wall; and the pressurization portion is disposed on the second side wall in an elastically deformable manner and pressurizes the flange portion from a side surface. According to the present structure, it is possible to provide a structure that makes it possible to surely fix the connection portion to the frame without increasing the number of components from the conventional structure and changing the structure of the connection portion.

In the tuner having any one of the above first to fifth structures, a structure (sixth structure) may be employed, in which the above connector is an F type connector. However, the connector is not limited to the F type connector, but may be, for example, a coaxial connector of another type and the like.

According to the present invention, it is possible to provide a tuner in which a connection portion, to which a connector is connected, can be surely fixed to a frame and the mounting work of the connection portion can be smoothly performed.

DETAILED DESCRIPTION OF THE PREFERRED EMBODIMENTS

Figure 1:
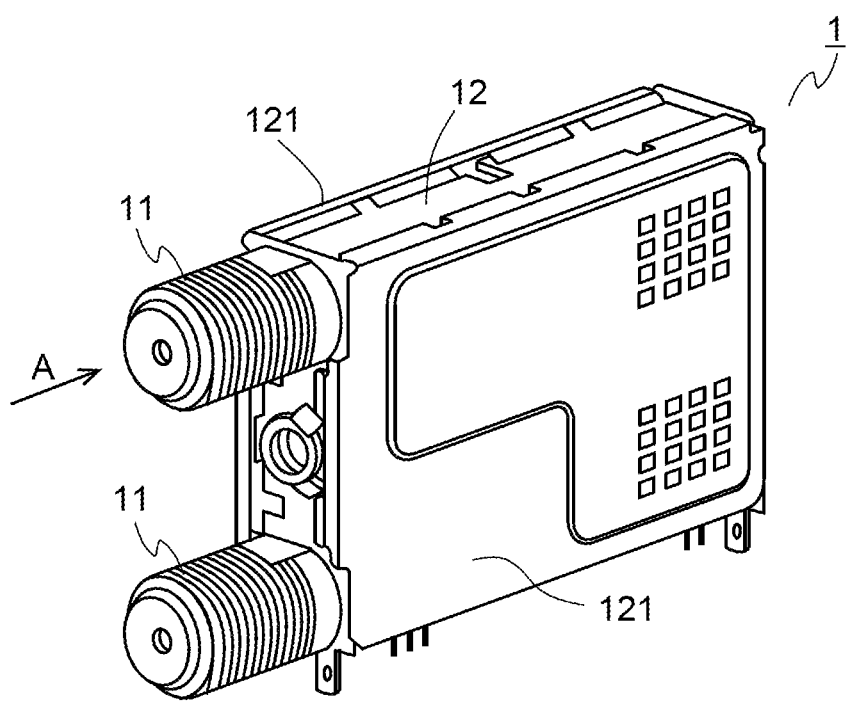
FIG. 1 is a schematic perspective view showing a structure of a tuner according to an embodiment of the present invention.

Hereinafter, an embodiment of a tuner according to the present invention is described in detail with reference to the drawings FIG. 1 is a schematic perspective view showing a structure of a tuner 1 according to the embodiment of the present invention. The tuner 1 is a circuit apparatus that includes a tuning circuit which tunes in a broadcast signal. As shown in FIG. 1, the tuner 1 includes: two connection bases 11, 11; a frame 12 on which the two connection bases 11, 11 are mounted; and two covers 121, 121 that are disposed oppositely to each other to cover an inside of the frame 12. A circuit board (tuner board), which is covered by the two covers 121, 121, is also mounted on the frame 12. For example, this tuner 1 is mounted on a mother board or the like of broadcast reception apparatuses (a television receiver, an optical disc apparatus and the like).

In the meantime, the two connection bases 11, 11 have the same structure. In the present embodiment, one of the two connection bases 11, 11 is used as an input terminal, while the other is used as an output terminal. In the meantime, the number of connection bases disposed in the tuner may be changed suitably, that is, plural or single. Besides, the connection base 11 is an example of a connection portion of the present invention to which the connector is connected.

Figure 2:
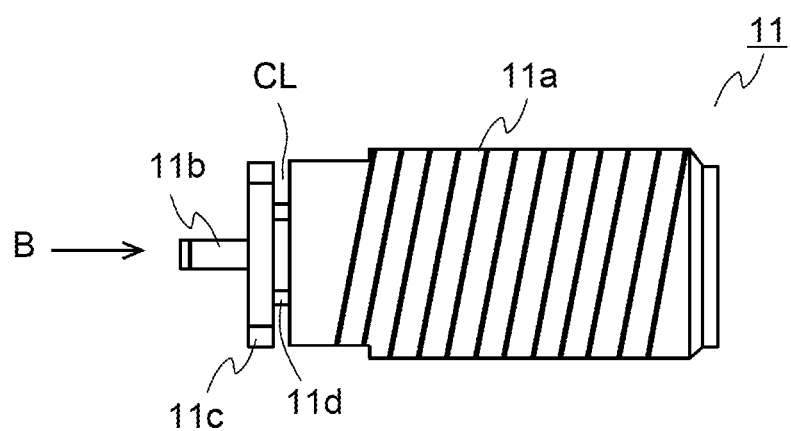
FIG. 2 is a schematic side view showing a structure of a connection base of a tuner according to an embodiment of the present invention.
Figure 3:
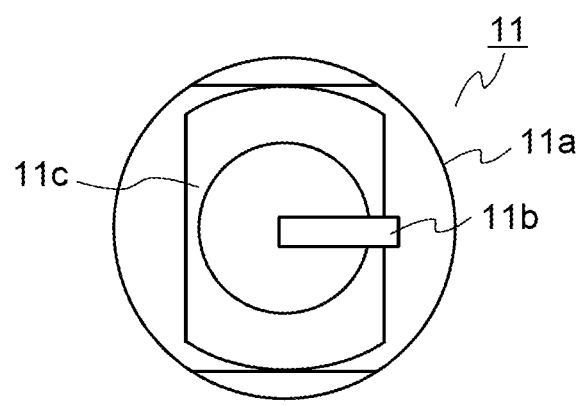
FIG. 3 is a schematic plan view when seeing the connection base along an arrow B direction of FIG. 2.

FIG. 2 is a schematic side view showing a structure of the connection base 11 of the tuner 1 according to the embodiment of the present invention. FIG. 3 is a schematic plan view in a case of seeing the connection base 11 along an arrow B direction of FIG. 2. In the present embodiment, as the connection base 11, a type of connection base connected to an F type connector (an example of a coaxial connector) is used. However, the connection base 11 may be of another type other than the type connected to the F type connector: the F type connector is a mere example.

As shown in FIG. 2 and FIG. 3, the connection base 11 includes a cylindrical main body portion 11a composed of a conductor. An outer surface of the main body portion 11a is provided with a screw groove that screws on a nut and a screw portion of a connector. A core-line connection metal fitting 11b, a portion of which is formed to protrude from one end of the main body portion 11a, is disposed in an insulated state in the main body portion 11a. The core-line connection metal fitting 11b is composed to be connected electrically to a core line of a connector in a case where the connector (not shown) is fitted on the other end of the connection base 11. The core-line connection metal fitting 11b is finally connected electrically to an electrode pad of the tuner board that is mounted on the tuner 11.

Besides, the one end of the main body portion 11a (one end where the core-line connection metal fitting 11b is disposed) is provided with a flange portion 11c which is disposed across a gap CL to oppose the main body portion 11a and has an outer shape of a substantially rectangular plate. The flange portion 11c is connected to the main body portion 11a by a coupling portion 11d.

Figure 4:
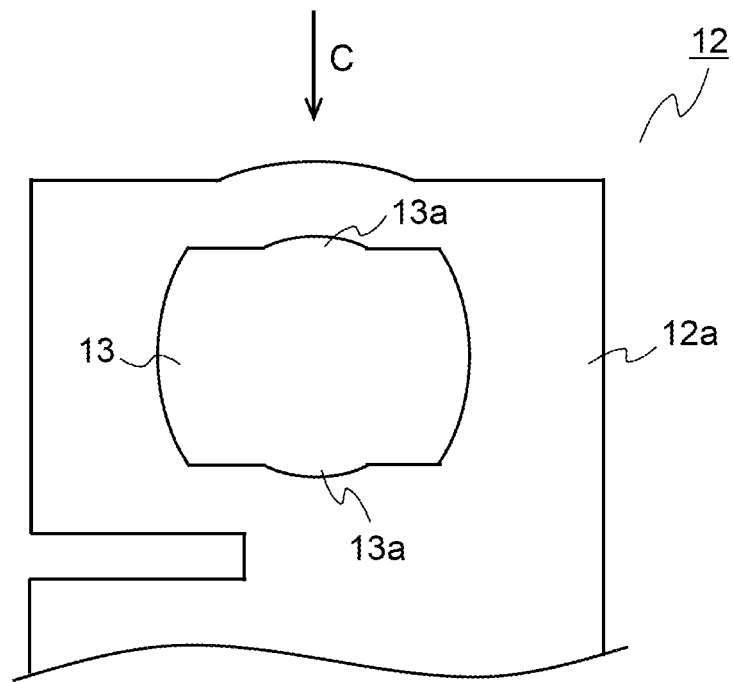
FIG. 4 is a schematic plan view showing a partial structure of a frame of a tuner according to an embodiment of the present invention.

FIG. 4 is a schematic plan view showing a partial structure of the frame 12 of the tuner 1 according to the embodiment of the present invention. In the meantime, FIG. 4 is a schematic plan view when seeing the frame 12 along an arrow A direction of FIG. 1, and shows only around a portion where the upper connection base 11 of FIG. 1 is mounted. As shown in FIG. 4, a first side wall 12a composing the frame 12 is provided therethrough a through-hole 13 that is formed into a substantially rectangular shape when seen from top. This through-hole 13 is used when mounting the connection base 11 onto the frame 12. In the meantime, as described above, the two connection bases 11, 11 are mounted on the frame 12; accordingly, the first side wall 12a is provided with one more through-hole that is identical to the through-hole 13.

Figure 5:
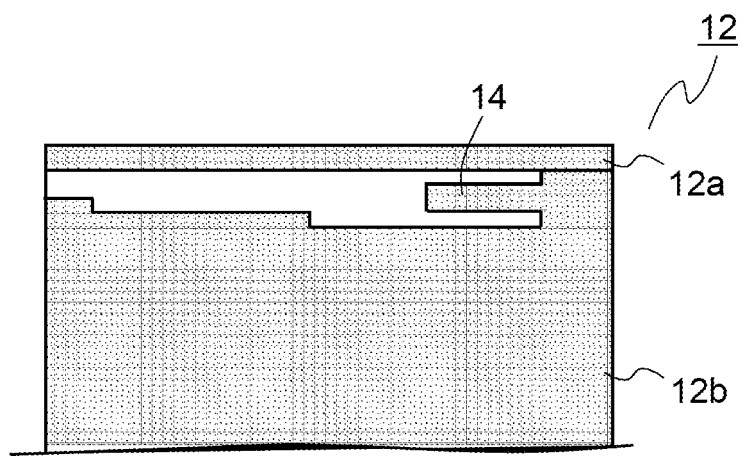
FIG. 5 is a schematic plan view showing a partial structure of a frame of a tuner according to an embodiment of the present invention, but a view showing a portion different from FIG. 4.

FIG. 5 is a schematic plan view showing a partial structure of the frame 12 of the tuner 1 according to the embodiment of the present invention, and is a view showing a portion different from FIG. 4. FIG. 5 is a schematic plan view when seeing the frame 12 along an arrow C direction of FIG. 4, and shows only around a portion where the upper connection base 11 of FIG. 1 is mounted.

As shown in FIG. 5, the frame 12 includes a second side wall 12b that is disposed to meet the first side wall 12a provided with the through-hole 13 at substantially right angles. As to this second side wall 12b, substantially all of a portion, which is near the first side wall 12a provided with the through-hole 13, is cut away to form an arm portion 14 that is elastically deformable. In the meantime, this arm portion 14 is an example of a pressurization portion of the present invention.

Figure 6:
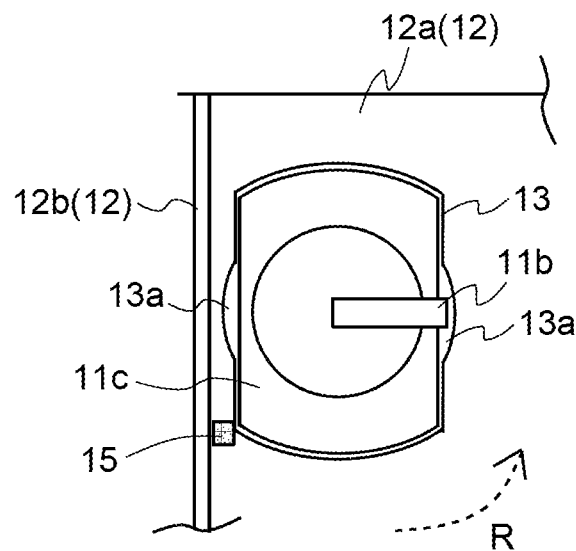
FIG. 6A is a view schematically showing a state when a flange portion of a connection base is inserted into a through-hole.
FIG. 6B is a view schematically showing a state when a flange portion of a connection base is rotated after being inserted into a through-hole.
Figure 6:
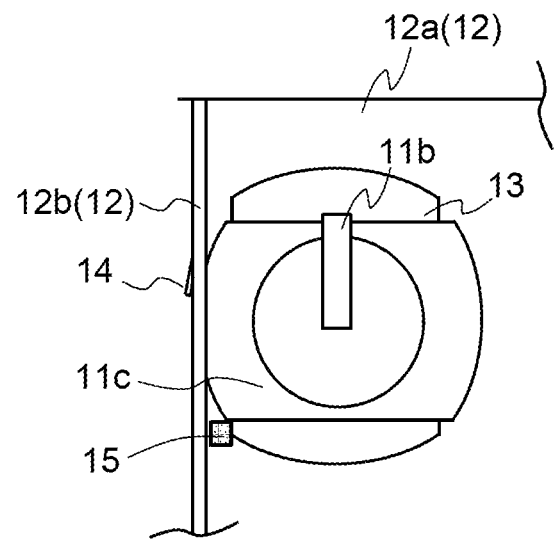
Figure 7:
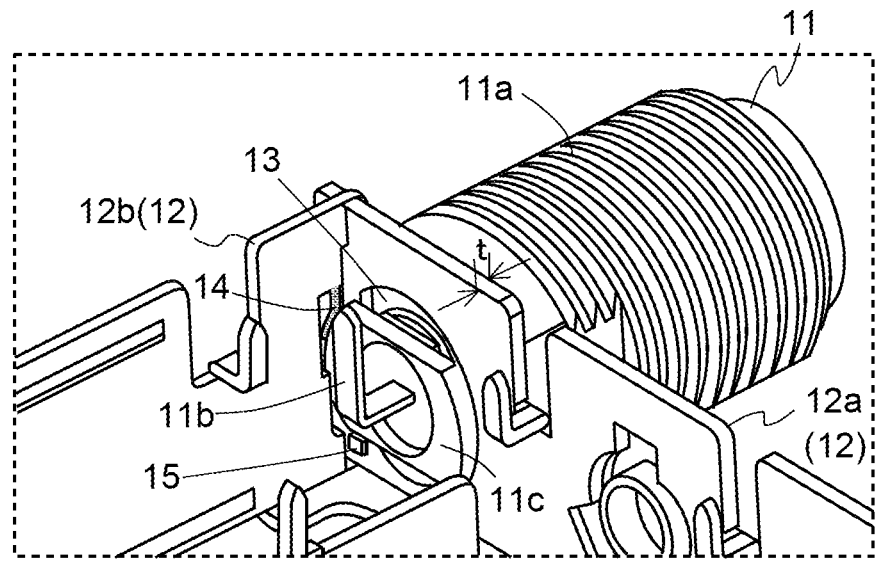
FIG. 7 is a schematic perspective view showing a state in which a connection base is fixed to a frame.
Figure 8:
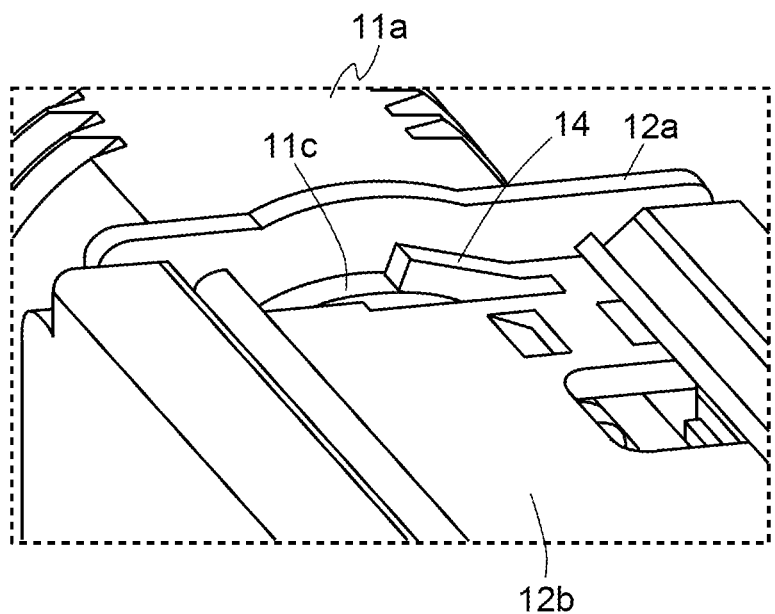
FIG. 8 is a schematic perspective view showing a state in which a connection base is fixed to a frame, but a view seen from a position different from FIG. 7.

Next, a procedure in which the connection base 11 is mounted onto the frame 12 is described with reference to FIG. 6A, FIG. 6B, FIG. 7, and FIG. 8. FIG. 6A is a view schematically showing a state when the flange portion 11c of the connection base 11 is inserted into the through-hole 13. Besides, FIG. 6B is a view schematically showing a state when the flange portion 11c of the connection base 11 is rotated after being inserted into the through-hole 13. FIG. 6A and FIG. 6B both are expected to be observed from an inside of the frame 12. FIG. 7 is a schematic perspective view showing a state in which the connection base 11 is fixed to the frame 12. FIG. 8 is a schematic perspective view showing a state in which the connection base 11 is fixed to the frame 12, but a view seen from a position different from FIG. 7. FIG. 7 is a view when the fixed state of the connection base 11 is seen from inside, while FIG. 8 is a view when the fixed state of the connection base 11 is seen from outside.

To mount the connection base 11 onto the frame 12, first, the connection base 11 is disposed in such a manner that the flange portion 11c opposes the through-hole 13. And the flange portion 11c of the connection base 11 is rotated and adjusted with respect to the through-hole 13 of the frame 12.

The flange portion 11c and the through-hole 13 are the same as each other in that both outer shapes have a substantially rectangular shape. In the meantime, in detail, an outer size of the through-hole 13 is slightly larger than an outer size of the flange portion 11c. Besides, considering a relationship with the coupling portion 11d (see FIG. 2) of the connection base 11 and a relationship with the core-line connection metal fitting 11b, the through-hole 13 is provided with curt-away portions 13a, 13b to form an arc-shaped inner wall, and in this point, the flange portion 11c and the through-hole 13 are slightly different from each other in the outer shape.

As shown in FIG. 6A, the directions of the substantially rectangular flange portion 11c and through-hole 13 are arranged to be the same as each other, whereby the flange portion 11c can pass through the through-hole 13. On the other hand, in a case where both directions are not the same, the flange portion 11c cannot pass through the through-hole 13. In other words, the flange portion 11c is structured to include a plane portion that has a first direction to pass through the through-hole 13, and a second direction not to pass through the through-hole 13.

When the connection base 11 is rotated and put into the state where the flange portion 11c can pass through the through-hole 13, the flange portion 11c passes through the through-hole 13 to be inserted into the frame 12. And, when the flange portion 11c is inserted into the frame 12, the connection base 11 is rotated about its center axis (center axis of the cylindrical main body portion 11). In this way, the flange portion 11c and the side wall 12a of the frame 12 interfere with each other, and the flange portion 11c cannot pass through the through-hole 13. In other words, the connection base 11 does not come off the frame 12.

The frame 12 is provided with a stopper portion 15 (example of a stopper portion of the present invention) that limits a rotation range of the flange portion 11c which is inserted from outside into the frame 12 via the through-hole 13. In the present embodiment, because of the presence of this stopper portion 15, the flange portion 11c inserted into the frame 12 has no other way but to rotate in only one direction (counterclockwise direction in FIG. 6A: R direction). Besides, the flange portion 11c rotated in the one direction butts the stopper portion 15 at a time pint of being rotated by 90° (this is a mere example) not to rotate any more (see FIG. 6B and FIG. 7). In the present embodiment, the position (position rotated by) 90° where the flange portion 11c butts the stopper portion 15 is used as a fixing position (exactly a temporary fixing position).

As described above, the side wall 12b of the frame 12 is provided with the arm portion 14 that is elastically deformable. Before the flange portion 11c comes to the position to butt the stopper portion 15, a side surface (end surface) of the flange portion 11c and the arm portion 14 begin to contact each other. After both begin to contact each other, the flange portion 11c is further rotated, whereby the arm portion 14 is pressurized by the flange portion 11c to begin to be elastically deformed and the arm portion 14 pressurizes the flange portion 11c thanks to reaction force due to the elastic deformation. This pressurization force gradually becomes large as the arm portion 14 rotates; accordingly, this pressurization force is unlikely to discourage the work of mounting the connection base 11 onto the frame 12.

However, if this pressurizing force becomes too large, the workability is caused to deteriorate; accordingly, for example, it is preferable that the size (length, width, thickness and the like of the arm) of the arm portion 14 is adjusted to find a suitable load by measuring a load with which the arm portion 14 pressurizes the flange portion 11c.

A structure is employed, in which in the case where the connection base 11 is disposed at the above fixing position, a portion of the coupling portion lid (see FIG. 2) of the connection base 11 butts an inner wall of the through-hole 13, so that the connection base 11 is disposed at a desired position of the frame 12. And, at the fixing position, the flange portion 11c is pressurized by the arm portion 14 (see FIG. 6B, FIG. 7, FIG. 8); accordingly, the connection base 11 is fixed to the frame 12. In other words, the arm portion 14 prevents the connection base 11 from rotating because of frictional force and the connection base 11 from moving from the desired position. Because of this, it is less likely that the connection base 11 disposed at the fixing position (temporary fixing position) moves obliquely from the desired state before the soldering (soldering to connect the connection base 11 and the frame 12 with each other), that is, the final fixing ends.

In other words, according to the structure of the present embodiment, during the soldering work, it is unnecessary to adjust, for example, the inclination of the connection base 11 and to mount again the connection base 11 onto the frame 12. And, at a completion time of the soldering, it is unlikely that the connection base 11 is mounted on the frame 12 in an inclined manner; accordingly, it is possible to smoothly perform the work, fulfilled later, of mounting the tuner board onto the frame 12. According to the structure of the present embodiment, it is possible to achieve improvement in the workability and the like avoiding adding a new component to the conventional structure and reforming the structure of the connection base 11, which is very useful.

In the meantime, the position of the stopper portion 15 is not limited to the position of the present embodiment, but may be suitably changed. However, according to the position of the present embodiment, it is easy to demonstrate a function to prevent the connection base 11 from moving from the temporary fixing position by supporting the connection base 11. Besides, if necessary, a structure may be employed, in which at the fixing position, an outer surface (side surface) of the flange portion 11c butts a protrusion or the like formed on the frame 12 instead of that the coupling portion 11d of the connection base 11 butts the inner wall of the through-hole 13.

In the meantime, in the present embodiment, a design is employed to obtain the structure, in which the gap CL (see FIG. 2; for example, about 0.5 mm) between the main body portion 11a and flange portion 11c of the connection base 11 becomes slightly smaller than the thickness t (see FIG. 7) of the side wall 12a of the frame 12. According to this structure, as described above, by rotating the connection base 11 after inserting the flange portion 11c into the frame 12 via the through-hole 13, it is possible to temporarily fix the connection base 11 to the frame 12 with no looseness (without being rotated) without using the arm portion (pressurization portion) 14. However, actually, if there is not the arm portion 14, because of unevenness in component dimensions, the connection base 11 becomes likely to move with respect to the frame 12 at the fixing position. Because of this, it is very useful to dispose the arm portion 14 as a rotation stopper that has a function to stop rotation.

Besides, in the above description, the mounting structure, procedure, and effects of only one of the two connection bases 11, 11 of the tuner 1 are described; however, the other is the same. Because of this, the description is skipped.

The embodiment described above is an example of the present invention, but the application scope of the present invention is not limited to the structure of the embodiment described above. It goes without saying that it is possible to suitably modify the above embodiment without departing from the technical concept of the present invention. For example, the shapes, sizes and the like of the members described above may be suitably modified.

What is claimed is:

1. A tuner comprising:
a frame that is provided with a through-hole; and
a connection portion to which a connector is connected; wherein
the connection portion includes a flange portion that is able to select to pass through the through-hole or not to pass through the through-hole by the connection portion being rotated; and
the frame includes a pressurization portion that pressurizes the flange portion which passes through the through-hole.

2. The tuner according to claim 1, wherein
the flange portion includes a planar portion that includes a first direction for passing through the through-hole and a second direction for not-passing through the through-hole.

3. The tuner according to claim 1, wherein
the pressurization portion changes a pressurization force for pressurizing the flange portion in accordance with a rotation amount of the flange portion.

4. The tuner according to claim 1, wherein
the frame includes a limit portion that limits rotation of the flange portion which is inserted into the through-hole.

5. The tuner according to claim 1, wherein
the frame includes a first side wall and a second side wall that meets the first side wall at right angles; wherein
the through-hole is disposed through the first through-hole; and
the pressurization portion is disposed on the second side wall in an elastically deformable manner and pressurizes the flange portion from a side surface.

* * * * *